United States Patent [19]
Garg et al.

[11] Patent Number: 5,124,179
[45] Date of Patent: Jun. 23, 1992

[54] INTERRUPTED METHOD FOR PRODUCING MULTILAYERED POLYCRYSTALLINE DIAMOND FILMS

[75] Inventors: Diwakar Garg; Sui-Yuan Lynn, both of Macungie; Robert L. Iampietro, Emmaus; Ernest L. Wrecsics, Bethlehem; Paul N. Dyer, Allentown, all of Pa.

[73] Assignee: Diamonex, Incorporated, Allentown, Pa.

[21] Appl. No.: 582,515

[22] Filed: Sep. 13, 1990

[51] Int. Cl.⁵ .............................................. C23C 16/00
[52] U.S. Cl. ..................... 427/249; 427/50; 427/122; 427/255.7; 427/402
[58] Field of Search ............ 427/38, 249, 50, 49, 427/122, 255.7, 402; 423/446

[56] References Cited

FOREIGN PATENT DOCUMENTS 63-307196 12/1988 Japan.
64-24093 1/1989 Japan.

OTHER PUBLICATIONS

Morrison et al. "Optical characteristics of diamond grown by plasma assisted chemical vapor deposition." SPIE vol. 1112 Window and Dome Technologies and Materials (1989) pp. 186-191.

Taborek. "Optical properties of microcrystalline CVD diamond" SPIE vol. 1112 Window and Dome Technologies Materials (1989) pp. 205-211.

Primary Examiner—Michael Lusigman
Assistant Examiner—Roy V. King
Attorney, Agent, or Firm—McCubbrey, Bartels, Meyer & Ward

[57] ABSTRACT

The method for depositing multilayers of PCD film onto the substrate comprises chemically depositing a polycrystalline diamond layers onto the substrate at deposition temperatures in the range of 650° to 825° C., interrupting the deposition process with a cool-down step and then depositing at least one other layer under the same deposition conditions. The method enables one to deposit PCD films having a thickness of at least 12 microns for applications on flat as well as curved substrates having wide use in the electronics industry. Thick PCD films of this invention have been found to be ideal for dissipating heat from radio frequency (RF) and microwave (MW) devices.

43 Claims, 5 Drawing Sheets

INTERRUPTED METHOD FOR PRODUCING MULTILAYERED POLYCRYSTALLINE DIAMOND FILMS

FIELD OF THE INVENTION

This invention relates generally to the manufacture of polycrystalline diamond (PCD) coated substrates having particular application in integrated circuit devices. More particularly, the invention relates to a coated substrate product comprised of a plurality of thick, adherent and coherent polycrystalline diamond (PCD) layers deposited on a substrate having high electrical resistivity, and to a method for producing same.

BACKGROUND OF THE INVENTION

A number of chemical vapor deposition (CVD) techniques including hot filament CVD (HFCVD), RF plasma assisted CVD, microwave plasma assisted CVD, DC plasma assisted CVD and laser assisted CVD methods have been used to deposit thin (1-10 μm), adherent and coherent PCD films on a variety of substrates. However, these methods have not been successful in depositing thick ($\geq 12$ μm) PCD films adherently and coherently on metallic and ceramic substrates. Furthermore, the films deposited by these techniques have been found to have poor electrical properties, making them unsuitable for the electronics industry.

The electrical properties of PCD films can be greatly improved by depositing them with enhanced crystal orientation in the (220) and (400) planes, as disclosed in a commonly assigned copending patent application, U.S. patent Ser. No. 497,161, filed 20 Mar. 1990, now abandoned. These PCD films have been successfully deposited at low as well as high rates on metallic substrates such as molybdenum and ceramics such as silicon with good adhesion. The adhesion has been shown to be extremely good as long as the film thickness is limited to 10 μm. Although it is possible to deposit thicker films (>10 μm) at high rates both on molybdenum and silicon, their adhesion to these substrates has been noted to be poor. The PCD films on molybdenum have been found to simply flake off during cooling of the coated specimens from the deposition temperature to room temperature. Likewise, the films on silicon have been noted to be under high stress, causing the coated silicon to disintegrate into pieces. The disadvantages of such thick PCD films are set forth more fully below.

Several attempts have been made by researchers to deposit thick PCD films on metallic and ceramic substrates with limited success. The differences between the coefficients of thermal expansion of diamond and metals cause the thick films to separate from metallic substrates as the coated substrates cool from deposition temperature to room temperature, as reported by Peter Taborek in a recent paper entitled, "Optical Properties of Microcrystalline CVD Diamond," published in SPIE, Vol. 1112, Window and Dome Technologies and Materials, 205-209 (1989).

The thick films have, however, been reported to adhere well to silicon substrate, but they have been found to be under high stress (apparent from the resulting curvature of the substrate). In some cases the stress is great enough to cause the sample to disintegrate into pieces, as reported by D. Morrison and J. A. Savage in a paper entitled, "Optical Characteristics of Diamond Grown by Plasma Assisted Chemical Vapor Deposition," published in SPIE, Vol. 1112, Window and Dome Technologies and Materials, 186-191 (1989). Therefore, there is a need to develop technology to deposit thick PCD film adherently and coherently on metallic and ceramic substrates.

Japanese Kokai Patent No. Sho 63(1988)-307196, published 14 Dec. 1988, discloses a microwave plasma assisted CVD method of manufacturing multilayered PCD film preferentially oriented in the (220) crystalline direction. In this patent application, the diamond deposition conditions such as the concentration of methane in hydrogen are changed continuously or discontinuously to deposit distinct diamond layers with different properties. For example, the first layer of the microcrystal diamond film with 0.1 μm thickness is formed using high concentrations of methane in hydrogen (such as 2%). The second layer is deposited on the first layer with good crystallinity using low concentrations of methane in hydrogen (such as 0.3%). This application does not disclose a method of depositing thick, uniform, adherent and coherent PCD film on a substrate.

U.S. Pat. No. 4,816,286 discloses an HFCVD method for depositing PCD film to a thickness as high as 28 μm on various substrates at deposition rates of about 3 μm per hour and higher; see Examples 1-8 starting at column 5, line 48 through Table 1 bridging columns 7 and 8. It has been found that at this rate of deposition the adhesion of PCD films to the substrates is poor.

Thin (10 μm) PCD films are suitable for many applications including low-power, direct-current, or low-frequency devices for dissipating heat from the devices as well as for isolating the devices from the base materials. They are, however, not suitable for high-frequency and/or high-power devices with large areas because of their high capacitance. The desired value of capacitance for these devices is $\leq 3$ pF, requiring the use of thick PCD films for these applications. The thickness of a PCD film required for a particular application depends largely upon the device area and can be calculated by the following expression:

$$C = E_o K \frac{A}{t}$$

where:
C = capacitance of PCD film in pF
K = dielectric constant of PCD film (assumed to be 5.5 for diamond)
A = device or chip area (cm$^2$)
t = PCD film thickness (cm)
$E_o$ = free-space permittivity (8.85 × 10$^{-2}$ pF/cm)

A relationship between PCD film thickness and device or chip area can thus be established by plugging in the values of $E_o$, K and desired capacitance in the above equation. The relationship between film thickness and device area can therefore be represented by the following expression:

$$t \geq 0.162 \, A$$

This expression can be used to calculate the thickness of PCD film required for devices having different areas, and the calculated values are summarized below.

Device Area, cm$^2$

| Device Area, cm² | | | | | | | |
|---|---|---|---|---|---|---|---|
| $1.1 \times 10^{-3}$ | $10 \times 10^{-3}$ | $15 \times 10^{-3}$ | $20 \times 10^{-3}$ | $25 \times 10^{-3}$ | $30 \times 10^{-3}$ | $50 \times 10^{-3}$ | $80 \times 10^{-3}$ |
| 2 | 16 | 24 | 32 | 41 | 49 | 81 | 130 |

Film Thickness, μm

These values indicate that ~10 μm thick PCD films will be suitable only for devices with area $<10 \times 10^{-3}$ cm². The devices commonly used by the electronics industry have areas $\geq 10 \times 10^{-3}$ cm², suggesting that the film thickness has to be $\geq 16$ μm to meet capacitance requirement. Therefore, there is a need for depositing thick PCD films on metallic and ceramic substrates with good adhesion and electrical properties. Further, the surface finish of polycrystalline diamond films can also be enhanced over that of prior art PCD films by depositing diamond crystals with enhanced orientation in at least two directions. This is an important feature in regard to mounting the device on the PCD film.

SUMMARY OF THE INVENTION

The improved multilayer composite structure of the present invention substantially reduces or eliminates the disadvantages and shortcomings associated with the prior art structures. The invention discloses a coated substrate product comprised of a parent substrate and plurality of separate CVD polycrystalline diamond layers of substantially uniform microstructure and having high electrical resistivity. The layers are deposited by interrupting the deposition process with a cool-down step and then depositing at least one other layer under the same or different deposition temperatures.

The invention also comprises a method for fabricating the multilayered product. According to the method, the plurality of polycrystalline diamond layers are chemically vapor deposited by an HFCVD technique on metallic and ceramic substrates. The resulting PCD film has a substantially uniform microstructure and smooth surface finish.

In a more specific embodiment of the present invention, the PCD film is chemically vapor deposited on metallic and ceramic substrates by a HFCVD technique with periodic interruptions, such that the PCD film is deposited with an enhanced crystal orientation, excellent electrical properties, and surface finish. The intensity of (HKL) reflection in the (220) or (311) direction and the (400) direction relative to (111) direction of the PCD films of the present invention are enhanced over that of industrial grade of diamonds. The diamond films of this invention exhibit particularly high electrical resistivity.

BRIEF DESCRIPTION OF THE DRAWINGS

Further features and advantages of the present invention will become apparent from the following and more particular description of the preferred embodiment of the invention as illustrated in the accompanying drawings, in which.

DETAILED DESCRIPTION OF THE INVENTION

Figure 1:
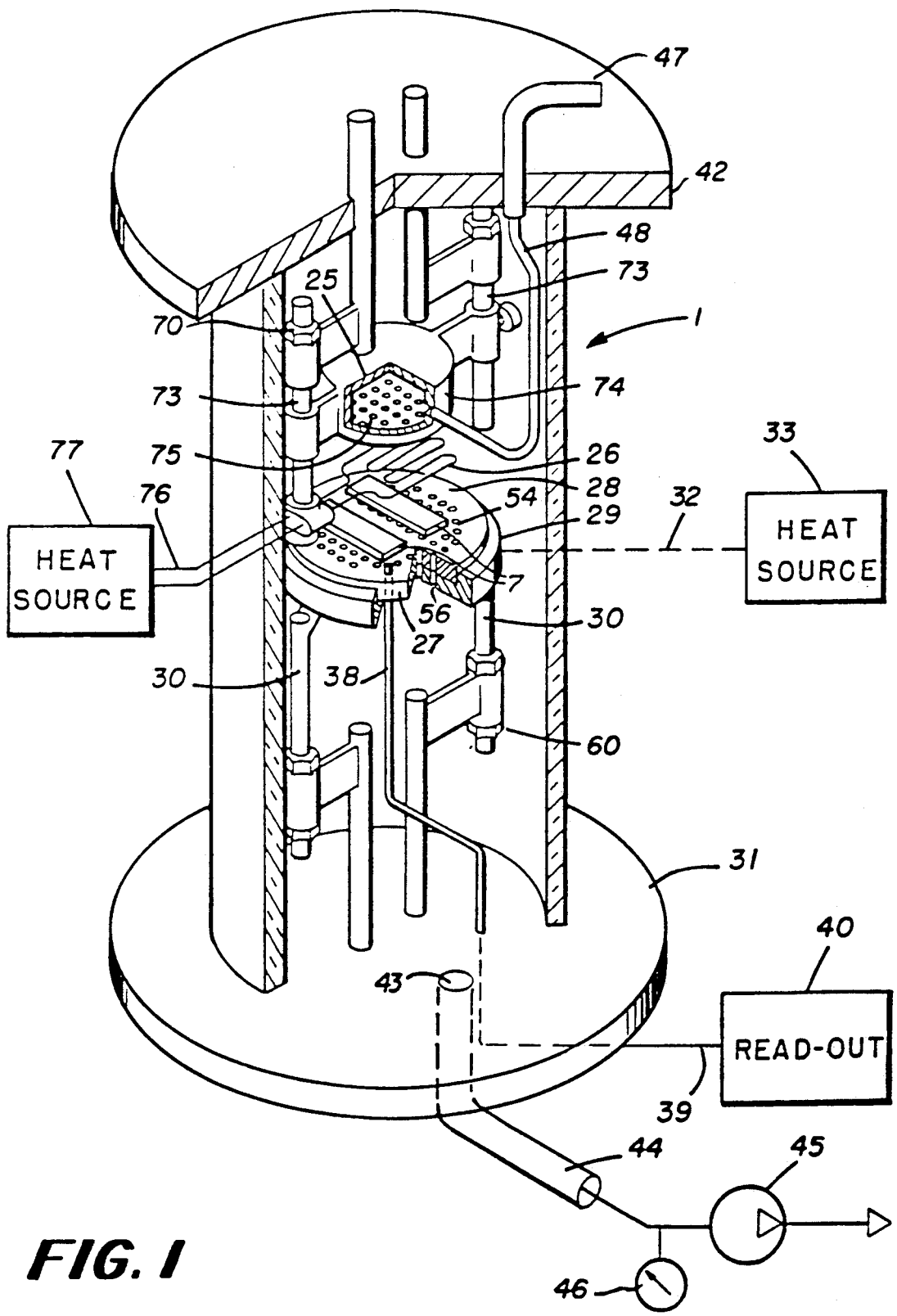
FIG. 1 is a simplified sectional view of a type of HFCVD reactor for use in carrying out the method of the present invention.

Thick PCD films can be deposited by carefully manipulating the build-up of stresses in the films. The build-up of stresses in the thick PCD films are controlled by employing one of the following methods:

(1) using low deposition rates ($<0.4$ μm/hr.), which method is which method and the resulting composition is disclosed and claimed in a commonly assigned copending patent application, Ser. No. 582,439, filed 13 Sep. 1990;

(2) periodically interrupting the deposition process by subjecting the coated substrate with a cool-down step, i.e. a step in which the coated substrate is cooled to temperatures substantially below the deposition temperatures, which method and resulting composition is disclosed and claimed herein; or (3) cycling the deposition temperature or other deposition parameters during the deposition of the PCD films, which method and resulting composition is disclosed and claimed in a commonly assigned copending patent application, Ser. No. 582,517, filed 13 Sep. 1990, now abandoned.

Each of these methods have been found to result in altering the microstructure of the PCD films, thereby helping in depositing thick films with reduced stresses. The thick films deposited by using these methods have been demonstrated to have good surface finish, adhesion and electrical properties.

The composition of the present invention is a multilayered composite structure which comprises a parent substrate and a plurality of polycrystalline diamond layers. The substrate on which diamond film is deposited comprises a single crystal such as diamond, silicon carbide, silicon, sapphire, and similar materials; a polycrystalline material such as silicon; a metal such as tungsten, molybdenum, titanium, tantalum, copper, and the like; a mixture of metals such as tungsten and molybdenum, tungsten and copper, molybdenum and copper, and the like; a ceramic material such as hot pressed, sintered or chemically vapor produced ceramics including silicon carbide, silicon nitride, polycrystalline diamond, cemented carbides, alumina, and the like or mixtures thereof. The substrate may contain various other layers and structures which constitute integrated circuitry. Such layers and structures may be formed before or after the application of the plurality of polycrystalline diamond layers.

Preferably the PCD layers are chemically vapor deposited on the substrate by means of an interrupted deposition technique such that the diamond layers exhibit enhanced crystal orientation in the (220), or (311) and (400) directions. In particular, the intensity of (HKL) reflection in the (220) and (400) directions in the film of the present invention are at least 47 and 12 percent, respectively, relative to (111) intensity, which is normalized to 100. The resulting structure thus enables the isolation of circuits and silicon devices from one another and from the base substrate via superior electrical properties of the polycrystalline diamond film, and exhibits a superior surface finish by substantially reducing the faceted crystals.

In the preferred embodiment of the invention, the polycrystalline diamond layers are chemically vapor deposited on a single crystal, a polycrystalline material, hard metal, metal alloy, mixture of metals, ceramic substrates or mixtures thereof, such that the polycrystalline diamond film exhibits enhanced crystal orientation in either the (220), or the (311) direction and the (400) direction over that of industrial grade diamonds.

By the phrase "chemically vapor deposited," it is meant the deposition of layers of polycrystalline diamond resulting from the thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful in this method include $C_1-C_4$ saturated hydrocarbons such as methane, ethane, propane and butane; $C_1-C_4$ unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (a detailed list of organic compounds that can be used to deposit a diamond layer with enhanced crystal orientation is provided in U.S. Pat. No. 4,816,286, which patent is incorporated herein by reference). The organic compound can be in admixture with water as described in Japanese Kokai Patent No. Sho 64(1989)-24093, published 26 Jan. 1989, which patent is incorporated herein by reference. The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or layer-like agglomerates of crystallites substantially free from intercrystalline adhesion binders.

The total thickness of the plurality of polycrystalline diamond layers can be at least about 12 μm. Preferably, the total thickness of the diamond layers is about 12 μm to 250 μm. Still more preferably, it is about 25 μm to about 130 μm.

The polycrystalline diamond films of the present invention may be deposited in the preferred method by using an HFCVD reactor such as reactor 1 illustrated in FIG. 1. The HFCVD technique involves activating a feed gaseous mixture containing a mixture of hydrocarbon and hydrogen by a heated filament and flowing the activated gaseous mixture over a heated substrate to deposit a first polycrystalline diamond layer during the first cycle of the process. The feed gas mixture, containing from 0.1 to about 5% hydrocarbon in hydrogen, is thermally activated under sub-atmosphere pressure ($\leq 100$ torr) to produce hydrocarbon radicals and atomic hydrogen by using a heated filament made of W, Ta, Mo, Re or a mixture thereof. The filament is electrically heated to a temperature ranging from about 1800° to 2250° C. The substrate on which the first layer of PCD film is to be deposited is heated to a temperature ranging from about 650° to 825° C. The control of substrate or deposition temperature at or below 825° C. is critical for depositing polycrystalline diamond films with enhanced crystal orientation, excellent electrical properties, and excellent surface finish. The use of deposition temperatures above 825° C. has been found to result in polycrystalline diamond crystals with random orientation. The use of deposition temperatures below 650° C., on the other hand, has been found to result in deposition of diamond films at extremely low and impractical rates.

After a period of at least 3 hours of diamond deposition time for the first cycle, the first cycle is interrupted and the cool-down step is commenced. During the cool-down step, the reactive gaseous mixture is stopped and an inert gas, i.e. argon, helium and the like, is passed over said coated substrate while the filament remains electrically charged for a period of time to purge the activated gaseous mixture from the reactor and then the coated substrate is cooled to temperatures substantially below the deposition temperatures by removing the charge from the filament while continuing to pass the inert gas over the substrate. Preferably the substrate is cooled to temperatures below about 600° C. More preferably the substrate is cooled to temperature below about 100° C.

After the cool-down step a second deposition cycle is conducted to deposit a second PCD layer onto the coated substrate at similar conditions using the procedures set forth above. The deposition temperature in the second and subsequent cycles can be same, higher or lower than the first cycle as long as it is less than 825° C. and greater than 650° C. The deposition cycles are repeated with a cool-down step between each cycle until the desired PCD film thickness is achieved.

Referring now to FIG. 1, the HFCVD reactor 1 for chemical vapor depositing a first layer of a PCD film onto substrates 7 and then for depositing at least an additional layer onto the coated substrates comprises a gas dispersion system 25, a filament network 26 and an apertured support plate 27. Gas dispersion system 25 and apertured support plate 27 are oriented within reactor 1 so that their surfaces are perpendicular to the axis of the gas flow through the reaction zone 28. Substrates 7 to be coated are supported by the apertured support plate 27 which rests on an apertured substrate heater 29. Substrate heater 29 is attached to adjustable rods 30, which are mounted to the reactor base 31. Substrate heater 29 is provided with lead 32 to which an electrical heating current is conducted from a suitable heat source 33. Substrate heater 29 is also provided with a thermocouple 38 to measure substrate temperature and a connecting electrical lead 39 through which the thermocouple output is transmitted to an external read-out or recorder/controller 40. To accurately record and control the temperature of the plurality of substrates 7 within the critical range of the method of the present invention, the tip of the thermocouple 38 is placed immediately adjacent to the top surface of one of the substrates, as shown in FIG. 1.

The ends of reactor 1 are enclosed by removable bottom plate 31 and top plate 42 which isolate reactor 1 such that the interior can be evacuated without significant inward leakage from the surrounding ambient atmosphere. In order to regulate the gas pressure within reactor zone 28 and remove reaction product gases, bottom plate 31 is provided with an opening 43 therein through which an exhaust port tube 44 is suitably connected to a vacuum pump 45. A vacuum gauge 46 is connected in the line thereto for indicating the pressure within the reactor chamber. By properly operating the vacuum pump 45, the gas pressure within the reactor chamber may be regulated as desired.

A gas inlet tube 47 is provided which extends through top plate 42. Gas inlet tube 47 is suitably connected to gas dispersion system 25 by means of a gas feed line 48. Gas inlet tube 47 is connected to a gas feed system (not shown) to introduce reactant gases into the reactor at desired flow rates.

Support plate 27 contains apertures 54 and heater 29 contains apertures 56 in heater 29 aligned with apertures 54 as shown in FIG. 1 to provide a means of flowing the reactant gas through the support plate 27 to reduce the extent of radial (stagnation point) flow adjacent to the substrates 7 and improving coating uniformity thereon. Support plate 27 and the substrate heater 29 assembly are provided with adjustable support rods 30 for varying the distance between substrates 7 and filament network 26, the support rods 30 consisting of threaded posts with lock nuts 60 removably secured thereon.

With the noted reactor apparatus, reactant gas is introduced into the reactor chamber through gas inlet tube 47 and gas feed line 48. Gas feed line 47 is connected to gas dispersion system 25 which introduces the reactant gas into reaction zone 28 of the reactor with substantially uniform axial gas velocity and temperature. Gas dispersion system 25 is supported within the reactor by a pair of adjustable rods 73, suitably connected to reactor cap 42; rods 73 consisting of threaded post with suitable lock nuts 70 removably secured thereon.

Gas dispersion system 25 consists of a thin housing 74 with an apertured bottom surface 75 to introduce and uniformly distribute the reactant gas over filament network 26.

Filament network 26 is also supported in reaction zone 28 by one of the adjustable rods 73. Filament network 26 is provided with lead 76 to which the heating current is conducted from a suitable heat source 77. Filament network 26 extends transversely in reaction zone 28 of the reactor and is oriented such that the maximum cross-sectional area of filament network 26 is perpendicular to the axis of the gas flow in reaction zone 28.

Additional details of the type of reactor system used in the method of the present invention are found in a commonly assigned copending application, Ser. No. 497,159, filed 20 Mar. 1990, now abandoned; the detailed description of which is incorporated herein by reference.

The controls and examples which follow illustrate the method of the invention and of the coated substrate products produced thereby. The examples are for illustrative purposes only and are not meant to limit the scope of the claims in any way.

PRE-CONDITIONING OF A NEW FILAMENT

A new tantalum filament made of 1 mm diameter and 21.6 cm long wire was fabricated and placed in the small scale HFCVD reactor described above. The total surface area of the filament was $\sim 8.5$ cm$^2$. It was carburized in the reactor using a preferred procedure. The procedure involved heating the filament to $\sim 1800°$ C. in the presence of 100 sccm flow of 1% CH$_4$ in H$_2$ at 30 torr. The filament temperature was increased in steps of 50° C. every 30 minutes until a temperature of $\sim 2200°$ C. was reached. This temperature was maintained for 30 minutes. The temperature and flow rate of 1% CH$_4$ in H$_2$ were then reduced to 2100° C. and 20 sccm, respectively, and maintained for another 12 hours. The filament power was then turned off and it was cooled in flowing helium gas. The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing PCD films on metallic and ceramic substrates in all the controls and examples described below. In some of those controls and examples a used tantalum filament (filament used previously in depositing PCD films in one or more experiments) was utilized for depositing PCD films. In no case was a virgin tantalum filament used for depositing PCD films.

CONTROLS

A number of control experiments were carried out to deposit PCD films using the HFCVD technique described above in which the deposition parameters were changed to deposit thin as well as thick films.

CONTROL 1

Two 1.35 in. long×0.387 in. wide×0.062 in. thick molybdenum specimens were placed in the HFCVD reactor described above. The specimens were pre-etched for 3 hours in an ultrasonic bath using a slurry of $\sim 80$ mm diamond powder in ethanol. They were then heated to 780° C. temperature using a filament made of $\sim$ ˜m diameter tantalum wire, which was pre-carburized, placed $\sim 10$ mm above the specimens and heated to $\sim 2160°$ C. temperature using an AC power supply. The filament temperature was determined by using a dual wavelength pyrometer. The specimen temperature, however, was determined by placing a thermocouple next to its top surface as shown in FIG. 1. A flow of 10 sccm of 1% CH$_4$ in H$_2$ was passed through the reactor for 15 hours to deposit polycrystalline diamond coating on molybdenum specimens, as shown in Table 1. After the deposition time of 15 hours, the flow of feed gas was switched from 10 sccm of 1% CH$_4$ in H$_2$ to $\sim 50$ standard cubic centimeters per minute (sccm) of He. The filament power was turned off after ½ hour and the coated specimens were cooled under flowing He gas. The molybdenum specimens were deposited with $\sim 7$ μm thick, adherent and coherent PCD film on the top of $\sim 4$ μm thick molybdenum carbide interlayer, which was formed in situ. The rate of PCD deposition in this example was $\sim 0.47$ μm/hour. The film exhibited excellent electrical resistivity, as shown in Table 1.

Control 1 showed that thin PCD films can be deposited adherently and coherently on metallic substrates using conventional HFCVD technique.

CONTROL 2

The PCD deposition experiment described in Control 1 was repeated using similar reactor design, type of specimens, and deposition conditions with the exception of using 790° C. specimen temperature, as shown in Table 1. The specimens were pre-etched only for 1 hour in an ultrasonic bath using a slurry of ~80 μm diamond powder in ethanol. The specimens were deposited with ~9 μm thick, adherent and coherent PCD film at the top of ~3 μm thick molybdenum carbide interlayer, as shown in Table 1. The deposition rate was ~0.60 μm/hr. The PCD film exhibited excellent electrical resistivity.

This control indicated that reducing the etching time from 3 hours to 1 hour was not detrimental to the adhesion of PCD film on molybdenum. It also showed that thin PCD films (~9 μm) can be deposited on metallic substrates adherently and coherently using conventional HFCVD technique.

CONTROL 3

Figure 2:
FIGS. 2, 3 and 4 are scanning electron micrographs at 5000 times magnification of compositions comprising PCD films deposited by HFCVD on molybdenum in accordance with the disclosure in the copending application, Ser. No. 497,161, filed 20 Mar. 1990.

The PCD deposition experiment described in Control 2 was repeated with the exception of using 22 hrs of deposition time instead of 15 hours, as shown in Table 1. The specimens were, once again, pre-etched only for 1 hour in an ultrasonic bath using a slurry of ~80 μm diamond powder in ethanol. The specimens were deposited with 11 μm thick, adherent and coherent PCD film at the top of 3 μm thick molybdenum carbide interlayer (see Table 1). The deposition rate was ~0.50 μm/hour. The PCD film had fairly good surface finish, as shown in FIG. 2.

This control, once again, indicated no detrimental effects of reducing the etching time from 3 hours to 1 hour in depositing a thin PCD film on molybdenum. It also showed that thin PCD films (~11 μm) can be deposited on metallic substrates adherently and coherently using conventional HFCVD technique.

CONTROL 4

The PCD deposition experiment described in Control 1 was repeated using similar reactor design, type of specimens, and deposition conditions with the exception of using 800° C. specimen temperature, as shown in Table 1. The specimens were pre-etched for 2 hours in an ultrasonic bath using a slurry of ~80 μm diamond powder in ethanol. The specimens were deposited with ~12 μm thick PCD film at the top of ~5 μm thick molybdenum carbide interlayer. The deposition rate in this experiment was ~0.8 μm/hour, which was higher than that noted in Controls 1 to 3. The PCD film on both specimens spalled off completely probably due to build-up of stresses. The film had enhanced crystal orientation in (220), (311) and (400) directions relative to (111) direction, as shown in Table 2.

This control showed that PCD films with thicknesses ~12 μm or greater can not be deposited adherently and coherently on metallic substrates using the conventional HFCVD technique.

CONTROL 5

Figure 3:

The PCD deposition experiment described in Control 4 was repeated with the exception of using 66 hours of deposition time. One of the specimens was pre-etched for 3 hours in an ultrasonic bath using a slurry of ~80 μm diamond powder in ethanol. The other specimen, on the other hand, was etched by polishing it with a paste containing ~3 μm diamond particles. The PCD film on each of these specimens was ~45 μm thick, resulting in a deposition rate of ~0.68 μm/hr, which was lower than noted in Control 4 but higher than those of Controls 1 to 3. The PCD film had a decent surface finish, as shown in FIG. 3. However, the PCD film on these specimens spalled-off completely, probably due to build-up of stresses by high deposition rate. The film showed enhanced crystal orientation in (220) and (400) directions relative to (111) direction as shown in Table 2.

This control, once again, showed that PCD films with thicknesses ≧12 μm can not be deposited adherently and coherently on metallic substrates using the conventional HFCVD technique.

CONTROLS 6A and B

One 1.35 in. long × 0.387 in. wide × 0.062 in. thick molybdenum specimen (Control 6A) and one 1.35 in. long × 0.387 in. wide silicon piece (Control 6B) were placed in a reactor described in Control 1. These specimens were pre-etched for 4 hours in an ultrasonic bath using a slurry of ~80 μm diamond powder in ethanol.

The specimens were heated to ~790° C. temperature using a filament made of ~1 mm diameter tantalum wire, which was placed ~10 mm above the specimens and heated to ~2170° C. temperature using an AC power supply. The filament was pre-carburized using the procedure described earlier. The filament and specimen temperatures were determined using the techniques described in Control 1. A flow of 10 sccm of 1% $CH_4$ in $H_2$ was passed through the reactor for 18 hours to deposit PCD film on molybdenum and silicon specimens, as set forth in Table 1. After the deposition time, the flow of feed gas was switched from 10 sccm of 1% $CH_4$ in $H_2$ to ~50 sccm of He. The filament power was turned off after ½ hour and the coated specimens were cooled under flowing He gas. The molybdenum specimen was deposited with ~7 μm thick, adherent and coherent PCD film at the top of ~3 μm thick carbide interlayer, which was formed in situ. The deposition rate was ~0.39 μm/hr, which was slightly lower than that noted in Controls 1-5. The silicon specimen was also deposited with ~7 μm thick adherent and coherent PCD film at the top of ~1 μm thick carbide interlayer. The coated silicon specimen was, however, bent a little due to build-up of stresses in the film during coating and upon cooling.

Controls 6A and B showed that thin PCD films (<12 μm) can be deposited adherently and coherently on metallic and ceramic substrates using the conventional HFCVD technique.

CONTROLS 7A and B

Figure 4:
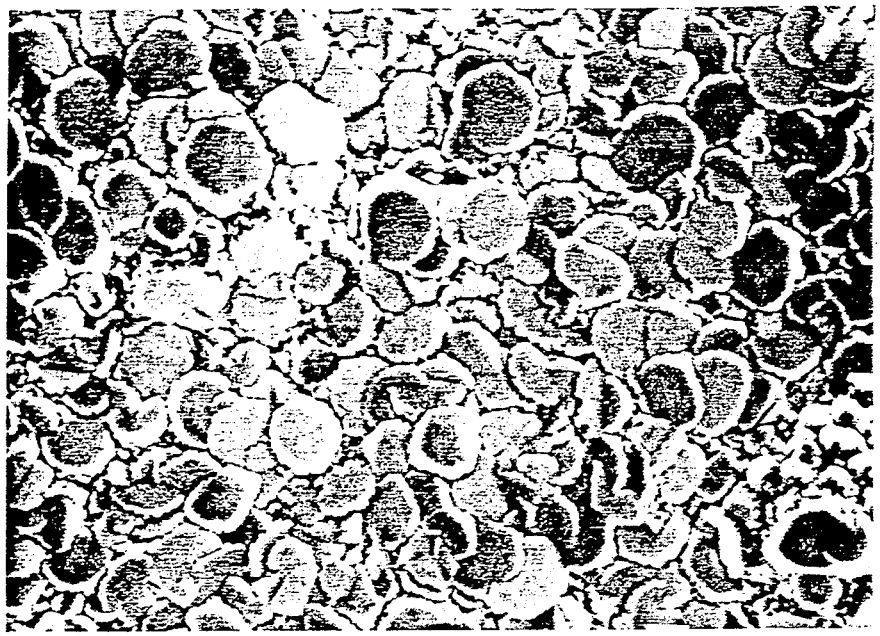
Figure 5:
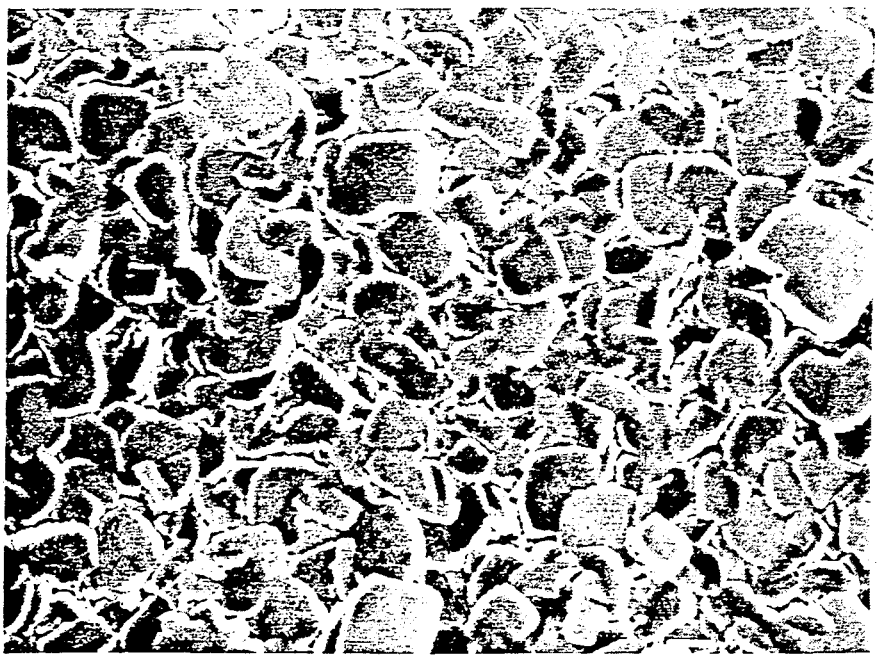
FIG. 5 is a scanning electron micrograph at 5000 times magnification of compositions comprising PCD film deposited by HFCVD on silicon in accordance with the disclosure in the copending application, Ser. No. 497,161, filed 20 Mar. 1990.

The PCD deposition experiment described in Controls 6A and B were repeated using similar reactor design, type of specimens, and deposition conditions except for using 780° C. specimen temperature and 16 hours deposition time. The specimens were pre-etched for 2 hours in an ultrasonic bath using a slurry of ~80 μm diamond powder in ethanol. The molybdenum specimen (Control 7A) was deposited with ~7 μm thick adherent and coherent PCD film at the top of ~3 μm thick carbide interlayer as set forth in Table 1. The silicon specimen (Control 7B) was also deposited with ~7 μm thick adherent and coherent PCD film at the top of ~1 μm thick carbide interlayer. The deposition rate both on molybdenum and silicon was ~0.44 μm/hr. The coated silicon specimen was, once again, bent a little due to build-up of stresses in the film during coating and upon cooling. The PCD films on molybdenum and silicon specimens had decent surface finish, as shown in FIGS. 4 and 5. The film had enhanced crystal orientation in (220) and (400) directions relative to (111) direction, as shown in Table 2.

Controls 7A and B showed that thin PCD films (<12 82 m) good surface finish can be deposited adherently and coherently on metallic and ceramic substrates using the conventional HFCVD technique.

CONTROLS 8A and B

The PCD deposition experiment described in Controls 7A and B were repeated except for using 60 hours deposition time. The specimens were pre-etched for 3 hours in an ultrasonic bath using a slurry of ~80 μm diamond powder in ethanol. The thickness of PCD film on molybdenum and silicon specimens was ~32 μm, resulting in deposition rates of ~0.53 μm/hr. for each of Controls 8A and B as summarized in Table 1, which was very similar to that noted in Controls 1 to 3. The film on molybdenum spalled-off completely. The film spallation could be related to build-up of stresses due to high deposition rate or deposition of thick coating. The film adhered well to silicon, but the coated specimen was bent considerably due to build-up of stresses during coating and upon cooling. In fact, the coated silicon specimen disintegrated into pieces while removing from the reactor.

Control 8A and B showed that thick PCD films, i.e., greater than 11 μm, can not be deposited adherently and coherently on metallic and ceramic substrates using the conventional HFCVD technique.

CONTROL 9

Two 1.35 in. long × 0.387 in. wide × 0.062 in. thick molybdenum specimens were placed in a reactor shown in FIG. 1. The specimens were pre-etched for 1 hour in an ultrasonic bath using a slurry of ~80 μm diamond powder in ethanol. The specimens were heated to ~740° C. temperature using a filament made of ~1.5 mm diameter tantalum wire placed ~10 mm above the specimens. The filament was heated to ~1980° C. temperature using an AC power supply. The filament was pre-carburized using the procedure described earlier. The filament and specimen temperatures were determined using the techniques described in Control 1. A flow of 10 sccm of 1% $CH_4$ in $H_2$ was passed through the reactor for 20 hours to deposit PCD film on molybdenum specimens, as shown in Table 1. After the deposition time, the flow of feed gas was switched from 10 sccm of 1% $CH_4$ in $H_2$ to ~50 sccm of He. The filament power was turned off after ½ hour and the coated specimens were cooled under flowing Ha gas. The molybdenum specimens were deposited with ~4 μm thick, adherent and coherent PCD film at the top of ~2 μm thick carbide interlayer. The deposition rate was ~0.2 μm/hr, which was considerably lower than noted in Controls 1 to 8. The PCD film had excellent electrical resistivity, as shown in Table 1.

This control again showed that thin PCD films exhibiting excellent electrical resistivity can be deposited adherently and coherently on metallic substrates using the conventional HFCVD technique.

CONTROL 10

The PCD deposition experiment described in Control 9 was repeated using similar reactor design, pre-etching technique, and deposition conditions except for using silicon pieces and 750° C. specimen temperature. The silicon specimens were deposited with ~4 μm thick adherent and coherent PCD film at the top of ~1 μm thick carbide interlayer, which was formed in situ. The deposition rate was ~0.20 μm/hr. The PCD film has excellent electrical resistivity, as shown in Table 1. The coated specimens were however bent slightly due to build-up of stresses during coating and cooling. The film has enhanced crystal orientation in (311) and (400) directions relative to (111) direction, as shown in Table 2.

This control again showed that thin PCD films with excellent electrical resistivity can be deposited on ceramic substrates adherently and coherently using a conventional HFCVD technique.

CONTROL 11

Two 1.35 in. long × 0.387 in. wide × 0.062 in. thick molybdenum specimens were placed in the same reactor used in the foregoing controls. The specimens were pre-etched for 3 hours in an ultrasonic bath using a slurry of ~80 μm diamond powder in ethanol. The specimens were heated to ~800° C. temperature using a filament made of ~1.25 mm diameter tantalum wire placed ~10 mm above the specimens. The filament was heated to ~2180° C. temperature using an AC power supply. The filament was pre-carburized using the procedure described earlier. The filament and specimen temperatures were determined using the techniques described in Control 1. A flow of 10 sccm of 1% $CH_4$ in $H_2$ was passed through the reactor for 20 hours to deposit PCD film on molybdenum specimens (see Table 1). After the deposition time, the flow of feed gas was switches from 10 sccm of 1% $CH_4$ in $H_2$ to ~50 sccm of He. The filament power was turned off after ½ hour and the coated specimens were cooled under flowing He gas. The molybdenum specimens were deposited with ~6 μm thick, adherent and coherent PCD film at the top of ~2 μm thick carbide interlayer, which was formed in situ. The deposition rate was ~0.3 μm/hr. The film showed good electrical resistivity, as shown in Table 1.

This control again showed that thin PCD films can be deposited adherently and coherently on metallic substrates using the conventional HFCVD technique.

CONTROL 12

The PCD deposition experiment described in Control 11 was repeated using similar reactor design, type of specimens, pre-etching technique, and deposition conditions except for using 5 sccm of 1% $CH_4$ in $H_2$ (see Table 1). The specimens were deposited with 4 μm thick, adherent and coherent PCD film at the top of 2 μm thick carbide interlayer. The deposition rate was 0.2 μm/hr. The film showed good electrical resistivity, as documented in Table 1.

This control showed that thin PCD films can be deposited adherently and coherently on metallic substrates using low flow rate of a mixture of 1% $CH_4$ in $H_2$.

CONTROL 13

The PCD deposition experiment described in Control 11 was repeated again using similar reactor design, type of specimens, pre-etching technique, and deposition conditions except for using 15 sccm of 1% $CH_4$ in $H_2$ (see Table 1). The specimens were deposited with ~7 μm thick, adherent and coherent PCD film with good electrical resistivity, as shown in Table 1. The deposition rate was ~0.35 μm/hr.

This control again showed that thin PCD films can be deposited adherently and coherently on metallic substrates using slightly higher flow rate of 1% $CH_4$ in $H_2$.

CONTROL 14

The PCD deposition experiment described in Control 11 was repeated using similar reactor design, type of specimens, pre-etching technique, and deposition conditions except for using 20 sccm of 1% $CH_4$ in $H_2$ (see Table 1). The specimens were deposited with 5 μm thick, adherent and coherent PCD film with good electrical resistivity, as shown in Table 1.

This control showed that thin PCD films can be deposited adherently and coherently on metallic substrates using higher flow rate of 1% methane in $H_2$.

Controls 1 to 14 showed that thin (<11 μm) PCD films can be deposited adherently and coherently on metallic and ceramic substrates using the conventional HFCVD technique. They also showed that the deposition of adherent and coherent thick ($\geq 12$ μm) PCD films can not be achieved by the conventional HFCVD technique. It is believed that the failure of depositing thick PCD films by the conventional HFCVD technique is related to buildup of stresses, resulting in film delamination.

EXAMPLES

A number of examples were carried out in accordance with the interrupted HFCVD method of the present invention to deposit thin as well as thick PCD films.

EXAMPLE 1

Two 1.35 in. long × 0.387 in. wide × 0.062 in. thick molybdenum specimens were placed in a reactor described in Control 1. The specimens were pre-etched for 3 hours in an ultrasonic bath using a slurry of ~80 μm diamond powder in ethanol. The specimens were deposited with PCD film using a cyclic process. For example, the specimens were heated to ~720° C. temperature in the first cycle using a filament made of 1.0 mm diameter tantalum wire placed ~10 mm above the specimens. The filament was pre-carburized using the procedure described earlier. The specimens were deposited with PCD film for 6 hours using 10 sccm of 1% $CH_4$ in hydrogen. After the deposition time of 6 hours the flow of feed gas was switched from 10 sccm of 1% $CH_4$ in $H_2$ to ~50 sccm of He. The filament power was turned off after ½ hour and the coated specimens were cooled to room temperature under flowing He gas. The entire deposition cycle was repeated one more time for 8 hours to deposit PCD film. The total deposition time therefore was 14 hours.

The specimens were deposited with ~7 μm thick, adherent and coherent PCD film with good electrical resistivity, as shown in Table 3. The film had enhanced crystal orientation in (220), (311) and (400) directions relative to (111) direction, as shown in Table 4. The deposition rate in this experiment was ~0.50 μm/hr, which was similar to that noted in Examples 1A-1H described earlier. This example therefore showed that an interrupted deposition process could be used to deposit thin PCD films adherently and coherently on metallic substrates.

EXAMPLE 2

Figure 6:
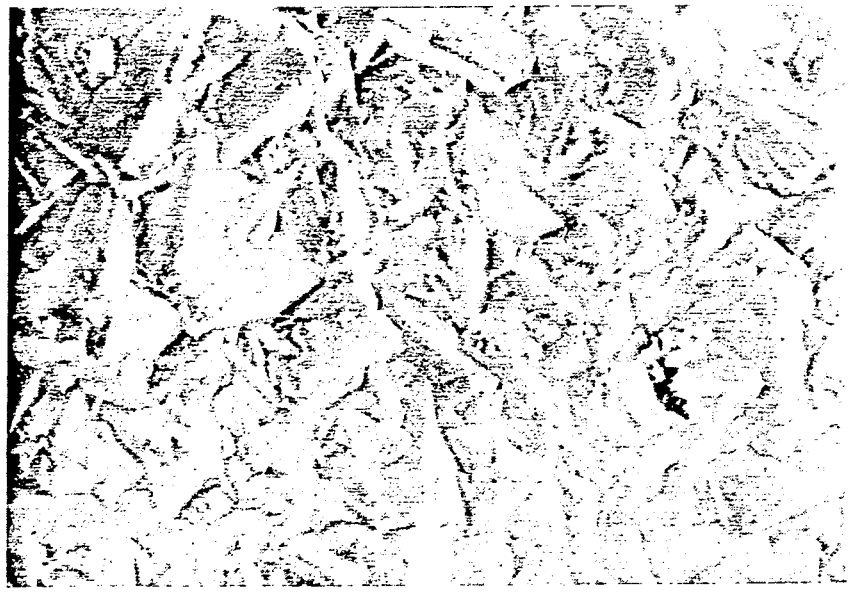
FIGS. 6-7 are scanning electron micrographs at 5000 times magnification of compositions comprising a plurality of PCD films deposited by HFCVD on molybdenum in accordance with the present invention.

The interrupted PCD deposition experiment described in Example 1 was repeated using similar reactor design, type of specimens, and pre-etching technique except for using 800° C. for 8 hours in the first cycle, as shown in Table 3. The specimens were then deposited with PCD film for an additional 7 hours at 800° C. in the second cycle to provide a total of 15 hours deposition time. The specimens were deposited with ~10 μm thick, adherent and coherent PCD film with good electrical resistivity, as shown in Table 3. The film had enhanced crystal orientation in (220) and (400) directions relative to (11) direction, as shown in Table 4. The deposition rate was ~0.67 μm/hr, which was similar to the high rates observed earlier. The film had decent surface finish, as shown in FIG. 6.

This example, once again, showed that thin PCD films could be deposited adherently and coherently on metallic substrates at high rates using an interrupted deposition process.

EXAMPLE 3

The interrupted PCD deposition experiment described in Example 1 was repeated using similar reactor design, type of specimens, and pre-etching technique except for using 820° C. for 8 hours in the first cycle, as shown in Table 3. The specimens were then deposited with PCD film for an additional 7 hours at 820° C. in the second cycle to provide a total of 15 hours deposition time. The specimens were deposited with ~10 μm thick, adherent and coherent PCD film with good electrical resistance, as shown in Table 3. The film had enhanced crystal orientation in (220) and (400) directions relative to (111) direction, as shown in Table 4. The deposition rate was 0.67 μm/hr.

EXAMPLE 4

The interrupted PCD deposition experiment described in Example 1 was repeated using similar reactor design, type of specimens, pre-etching technique, except for 800° C. deposition temperature and 7 hours each in two cycles for a total deposition time of 14 hours. The specimens were deposited with ~10 μm thick, adherent and coherent PCD film. The deposition rate was ~0.71 μm/hr. This example, therefore, showed that an interrupted process could be used to deposit ~10 μm thick PCD film adherently and coherently on metallic substrate at high deposition rates.

EXAMPLE 5

The interrupted PCD deposition experiment described in Example 4 was repeated using similar reactor design, type of specimens, pre-etching technique, and deposition conditions with the exception of using three cycles. The first cycle involved diamond deposition at 800° C. for 5 hours using conditions described in Table 3. The second and third cycles were carried out for 8 hours each to provide a total of 21 hours deposition time. The specimens were deposited with ~14 μm thick, adherent and coherent PCD film. The deposition rate was ~0.67 μm/hr, which was close to the high rates observed in Controls 1 to 7A-B.

The example therefore showed that thick (14 μm) PCD films could be deposited adherently and coherently on metallic substrates at high rates by using an interrupted deposition process. This is an unexpected and significant finding.

EXAMPLE 6

The interrupted PCD deposition experiment described in Example 4 was again repeated using similar reactor design, type of specimens, pre-etching technique, and deposition conditions with the exception of using four cycles. The first cycle involved PCD film deposition at 800° C. for 9 hours using conditions described in Table 3. The second, third and fourth cycles were carried out for 7, 7 and 6 hours, respectively, to provide a total of 29 hours deposition time. The specimens were deposited with ~19 μm thick, adherent and coherent PCD film. The deposition rate was ~0.66 μm/hr.

This example, once again, showed that thick PCD films (~19 μm) could be deposited adherently and coherently on metallic substrates at high rates using a novel interrupted deposition process.

EXAMPLE 7

The interrupted PCD deposition experiment described in Example 4 was repeated using similar reactor design, type of specimens, pre-etching technique, and deposition conditions with the exception of using five cycles. The first cycle involved PCD film deposition at 800° C. for 7 hours. The second, third, fourth and fifth cycles were carried out for 8, 6, 8 and 6 hours, respectively, to provide a total of 35 hours deposition time. The specimens were deposited with ~23 μm thick, adherent and coherent PCD film. The deposition rate was ~0.67 μm/hr.

Figure 7:
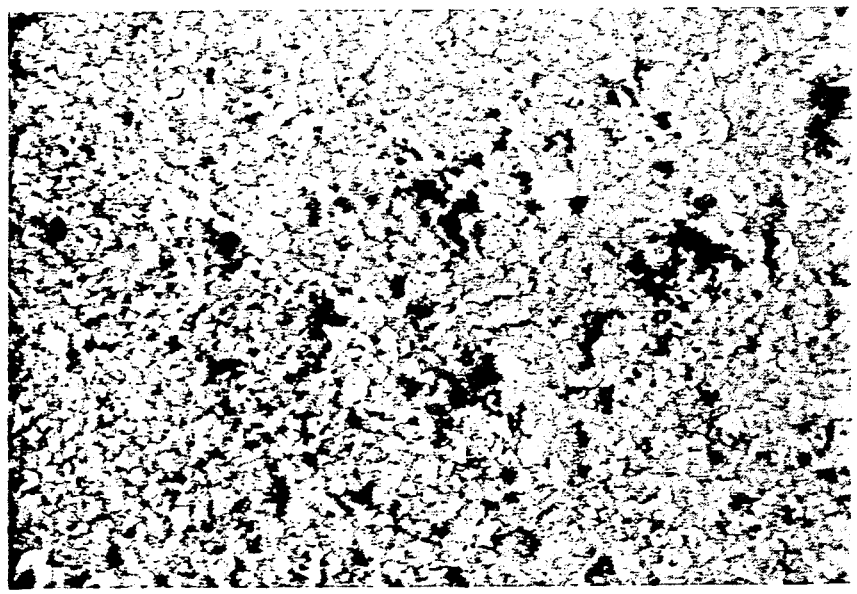
Figure 8:
FIG. 8 is a scanning electron micrograph at 5000 times magnification of the cross-section of compositions comprising a PCD film deposited by HFCVD on molybdenum in accordance with the present invention.

The PCD film deposited by using an interrupted deposition process surprisingly had a good surface finish, as shown in FIG. 7. The columnar growth pattern of PCD film was periodically disrupted by the interruptions in the process. These interruptions caused renucleation of diamond with the beginning of a new cycle. The repeated interruptions produced a fine-grained diamond film with reduced stresses and leaner columns, as shown in FIG. 8.

This example showed that thick PCD films (23 μm) with good surface finish could be deposited adherently and coherently on metallic substrates at high rates using a novel interrupted deposition process.

CONCLUSIONS

The foregoing examples illustrate that both thin and thick PCD films can be deposited adherently and coherently on metallic and ceramic substrates only by using the interrupted HFCVD technique. They also showed that PCD films with enhanced crystal orientation in (220) and (400) directions relative to (111) direction, good electrical resistivity, and surface finish can be produced by using the interrupted HFCVD technique.

Without departing from the spirit and scope of this invention, one of ordinary skill can make various changes and modification to the invention to adapt it to various usages and conditions. As such, these changes and modifications are properly, equitably, and intended to be, within the full range of equivalence of the following claims.

TABLE 1

| Control | 1 | 2 | 3 | 4 | 5 | 6A | 6B | 7A | 7B |
|---|---|---|---|---|---|---|---|---|---|
| Experiment No. | 49-1 | 47-1 | 55-1 | 46-1 | 41-1 | 44-1 | 44-1 | 45-1 | 45-1 |
| Substrate | Mo | Mo | Mo | Mo | Mo | Mo | Si | Mo | Si |
| Substrate Temp., °C. | 780 | 790 | 790 | 800 | 800 | 790 | 790 | 780 | 780 |
| Filament Temp., °C. | 2160 | 2180 | 2180 | 2210 | 2190 | 2170 | 2170 | 2160 | 2160 |
| Flow Rate of 1% CH$_4$ in H$_2$, sccm | 10 | 10 | 10 | 10 | 10 | 10 | 10 | 10 | 10 |
| Total Pressure, Torr | 30 | 30 | 30 | 30 | 30 | 30 | 30 | 30 | 30 |
| Deposition Time, Hrs. | 15 | 15 | 22 | 15 | 66 | 18 | 18 | 16 | 16 |
| Thickness, μm | | | | | | | | | |
| Molybdenum Carbide | ~4 | ~3 | ~3 | ~5 | N.D. | ~3 | ~1 | ~3 | ~1 |
| Diamond | ~7 | ~9 | ~11 | ~12 | ~45 | ~7 | ~4 | ~7 | ~7 |
| Deposition Rate, μm/hr | 0.47 | 60 | 0.50 | 0.80 | 0.68 | 0.39 | 0.39 | 0.44 | 0.44 |
| Resistivity, Ohm-cm | 1.1 × 10$^{12}$ | 3.2 × 10$^{11}$ | N.D. | N.D. | N.D. | N.D. | N.D. | N.D. | N.D. |
| Observations | ○ | ○ | ○ | ●● | ●● | ● | ● | ● | ● |

| Control | 8A | 8B | 9 | 10 | 11 | 12 | 13 | 14 |
|---|---|---|---|---|---|---|---|---|
| Experiment No. | 53-1 | 53-1 | 61-1 | 71-1 | 5-3 | 6-3 | 7-3 | 8-3 |
| Substrates | Mo | Si | Mo | Si | Mo | Mo | Mo | Mo |
| Substrate Temp., °C. | 790 | 790 | 740 | 750 | 800 | 800 | 800 | 800 |
| Filament Temp., °C. | 2170 | 2170 | 1980 | 1980 | 2180 | 2160 | 2170 | 2180 |
| Flow Rate of 1% CH$_4$ in H$_2$, sccm | 10 | 10 | 10 | 10 | 10 | 5 | 15 | 20 |
| Total Pressure, Torr | 30 | 30 | 30 | 30 | 30 | 30 | 30 | 30 |
| Deposition Time, Hrs. | 60 | 60 | 20 | 20 | 20 | 20 | 20 | 20 |
| Thickness, μm | | | | | | | | |
| Molybdenum Carbide | N.D. | N.D. | ~2 | ~1 | ~2 | ~2 | ~2 | ~2 |
| Diamond | ~32 | ~32 | ~4 | ~4 | ~6 | ~4 | ~7 | ~5 |
| Deposition Rate, μm/hr | 0.53 | 0.53 | 0.20 | 0.20 | 0.30 | 0.20 | 0.35 | 0.25 |
| Resistivity, | N.D. | N.D. | 4.8 × 10$^{10}$ | 3.2 × 10$^{10}$ | 1.3 × 10$^{10}$ | 2.1 × 10$^9$ | 1.1 × 10$^8$ | 3.1 × 10$^8$ |

TABLE 1-continued

Ohm-cm
Observations  •  ••  •  •  •  •  •  •

[a]The diameter of tantalum wire used for making filament in these experiments was ~1 mm
[b]The diameter of tantalum wire used for making filament in these experiments was ~1.5 mm
[c]The diameter of tantalum wire used for making filament in these experiments was ~1.25 mm
*Adherent and coherent film
**Film spalled completely
N.D. - Not determined

TABLE 2

Crystal Orientation and Average Size of PCD Films

| | INDUSTRIAL GRADE DIAMOND POWDER[2] | CONTROLS | | | |
|---|---|---|---|---|---|
| | | 4 | 5 | 7A | 10 |
| Experiment No. | | 46-1 | 41-1 | 45-1 | 71-1 |
| Intensity of (hkl) reflection relative to (111)[1] % | | | | | |
| (220)[3] | 25 | 135 | 57 | 130 | 22 |
| (311) | 16 | 19 | 9 | 14 | 26 |
| (400)[4] | 8 | 24 | 13 | 22 | 13 |

[1]The relative intensity of crystals in (111) direction is normalized to 100
[2]PDF 6-675
[3](220) Crystal orientation is parallel to (110) orientation, and therefore crystals are in the same family of planes
[4](400) Crystal orientation is parallel to (100) orientation, and therefore crystals are in the same family of planes

TABLE 3

| Example | 1 | 2 | 3 | 4 | 5 | 6 | 7 |
|---|---|---|---|---|---|---|---|
| Experiment No. | 51-2 | 31-2 | 29-2 | 64-2 | 65-2 | 66-2 | 67-2 |
| Substrate | Mo | Mo | Mo | Mo | Mo | Mo | Mo |
| Specimen Temp., °C | 720 | 800 | 820 | 800 | 800 | 800 | 800 |
| Filament Temp., °C | 2130 | 2200 | 2230 | 2180 | 2180 | 2180 | 2170 |
| Flow Rate of 1% $CH_4$ in $H_2$, sccm | 10 | 10 | 10 | 10 | 10 | 10 | 10 |
| Total Pressure, Torr | 30 | 30 | 30 | 30 | 30 | 30 | 30 |
| No. of Cycles | 2 | 2 | 2 | 2 | 3 | 4 | 5 |
| Total Deposition Time, Hrs | 14 | 15 | 15 | 14 | 21 | 29 | 35 |
| Diamond Thickness, μm | ~7 | ~10 | ~10 | ~10 | ~14 | ~19 | ~23 |
| Deposition Rate, μm/hr | 0.50 | 0.67 | 0.67 | 0.71 | 0.67 | 0.66 | 0.67 |
| Resistivity, Ohm-cm | $2 \cdot 10^{10}$ | $5 \cdot 10^{10}$ | $1.2 \cdot 10^9$ | N.D. | N.D. | N.D. | N.D. |
| Observations | * | * | * | * | * | * | * |

Note
The diameter of tantalum wire used for making filament in these experiments was ~1.0 mm
*Adherent and coherent film
N.D. - Not determined

TABLE 4

CRYSTAL ORIENTATION OF PCD FILMS

| | Industrial Grade Diamond Powder[2] | EXAMPLES | | |
|---|---|---|---|---|
| | | 1 | 2 | 3 |
| Intensity of (hkl) reflection relative to (111)[1] % | | | | |
| (220)[3] | 25 | 123 | 59 | 50 |
| (311) | 16 | 26 | 12 | 11 |
| (400)[4] | 8 | 31 | 14 | 13 |

[1]The relative intensity of crystals in (111) direction is normalized to 100.
[2]PDF 6-675
[3](220) Crystal orientation is parallel to (110) orientation, and therefore are in the same family of planes.
[4](400) Crystal orientation is parallel to (100) orientation, and therefore are in the same family of planes.

What is claimed is:

1. A chemical vapor deposition method for producing a coated substrate product comprising:
   placing a parent substrate comprising a material selected from the group consisting of a single crystal, polycrystalline materials, metal, metal alloy, mixture of metals, ceramic materials and mixtures thereof into a hot filament chemical vapor deposition reactor;
   chemically vapor depositing a first polycrystalline diamond layer onto said parent substrate using a hot filament during the first of at least two cycles;
   cooling the coated substrate after the first cycle to a temperature substantially below the deposition temperature; and
   chemically vapor depositing at least a second polycrystalline diamond layer onto said coated substrate using a hot filament.

2. The method of claim 1 wherein said coated substrate is cooled to a temperature below about 100° C. prior to applying the second polycrystalline diamond layer.

3. The method of claim 1 wherein said coated substrate is cooled to substantially room temperature prior to applying the second polycrystalline diamond layer.

4. The method of claim 1 wherein the length of time of each cycle is at least three hours.

5. The method of claim 1 wherein at least three separate polycrystalline diamond layers are chemical vapor deposited during at least three cycles in which each cycle is separated by a cool-down step.

6. The method of claim 5 wherein the total thickness of said polycrystalline diamond layers is at least about 12 μm.

7. The method of claim 1 wherein the total thickness of said polycrystalline diamond layers is in the range of about 12 μm to about 250 μm.

8. The method of claim 1 wherein the total thickness of said polycrystalline diamond layers is in the range of about 20 μm to about 130 μm.

9. The method of claim 1 wherein said separate polycrystalline diamond layers are each chemical vapor deposited at deposition temperatures in the range of 650° to 825° C.

10. The method of claim 1 wherein said polycrystalline diamond layers have electrical resistivity greater than $10^6$ ohm-cm.

11. The method of claim 1 wherein said parent substrate is molybdenum.

12. The method of claim 11 wherein molybdenum carbide is formed in situ between said parent substrate and said first polycrystalline diamond layer.

13. The method of claim 1 wherein said parent substrate is silicon.

14. The method of claim 13 wherein silicon carbide is formed in situ between said parent substrate and said first polycrystalline diamond layer.

15. The method of claim 1 wherein said coated substrate is cooled to a temperature below 600° C. between cycles.

16. The method of claim 1 wherein said coated substrate after applying said second polycrystalline diamond layer is cooled to substantially room temperature.

17. The method of claim 1 wherein the deposition temperature used in all the cycles is essentially the same.

18. The method of claim 1 wherein the deposition temperature used in the second cycle is lower than the first cycle.

19. The method of claim 1 wherein the deposition temperature used in the second cycle is higher than the first cycle.

20. The method of claim 1 wherein said polycrystalline diamond layer has at least partially ordered crystal orientation in at least two planes in comparison to industrial grade diamond crystals.

21. The method of claim 20 wherein said polycrystalline diamond layer has an enhanced crystal orientation in the (220) and (400) directions relative to the (111) direction.

22. The method of claim 21 wherein said polycrystalline diamond layer further includes an enhanced crystal orientation in the (311) direction relative to the (111) direction.

23. The method of claim 20 wherein said polycrystalline diamond layer has an enhanced crystal orientation in the (311) and (400) directions relative to the (111) direction.

24. A chemical vapor deposition method for fabricating a coated substrate product comprising:
    placing a parent substrate comprising a material selected from the group consisting of a single crystal, polycrystalline materials, metal, metal alloy, mixture of metals, ceramic materials and mixtures thereof into a hot filament chemical vapor deposition reactor;
    heating said parent substrate during a first cycle of at least one set of two cycles to a temperature in the range of about 650° to 825° C. by means of a filament electrically charged to a temperature in the range of about 1800° to 2250° C.;
    chemically vapor depositing during the first cycle of at least two cycles a first polycrystalline diamond layer having a thickness in the range of about 2 to about 10 μm onto the heated substrate by passing a gaseous mixture of hydrocarbons and hydrogen into said reactor for a period of at least three hours;
    passing an inert gas over said coated substrate while said filament remains electrically charged for a period of time to purge said reactor of said gaseous mixture during the commencement of a cool-down step;
    cooling said coated substrate by removing the charge from said filament and continuing the passing of the inert gas over the substrate until the temperature has reached substantially room temperature during said cool-down step;
    chemically vapor depositing during a second cycle of at least two cycles a second polycrystalline diamond layer having a thickness in the range of about 2 to about 10 μm onto said first layer for a period of at least an additional three hours; and
    recovering a substrate coated with a plurality of polycrystalline diamond layers exhibiting uniform microstructure and a high electrical resistivity.

25. The method of claim 24 wherein at least 3 cycles are used to deposit at least 3 polycrystalline diamond layers and in which each cycle is separated by a cool-down step.

26. The method of claim 25 wherein the length of time of each cycle is at least three hours.

27. The method of claim 24 wherein the total thickness of said polycrystalline diamond layers is in the range of about 12 μm to about 250 μm.

28. The method of claim 24 wherein the total thickness of said polycrystalline diamond layers is about 20 μm to about 130 μm.

29. The method of claim 24 wherein the deposition rate for each of said polycrystalline diamond layers is generally about 0.5 μm per hour.

30. The method of claim 24 wherein said polycrystalline diamond layers have electrical resistivity greater than $10^6$ ohm-cm.

31. The method of claim 24 wherein said parent substrate is molybdenum.

32. The method of claim 31 wherein 2 μm to 5 μm of molybdenum carbide is formed in situ between said parent substrate and said first polycrystalline diamond layer.

33. The method of claim 24 wherein said parent substrate is silicon.

34. The method of claim 33 wherein up to 1 μm of silicon carbide is formed in situ between said parent substrate and said first polycrystalline diamond layer.

35. The method of claim 24 wherein said coated substrate is cooled to a temperature below about 100° C. between cycles.

36. The method of claim 24 wherein said coated substrate is cooled to substantially room temperature.

37. The method of claim 24 wherein the deposition temperature used in all the cycles is essentially the same.

38. The method of claim 24 wherein the deposition temperature used in the second cycle is lower than the first cycle.

39. The method of claim 24 wherein the deposition temperature used in the second cycle is higher than the first cycle.

40. The method of claim 24 wherein said polycrystalline diamond layer has an enhanced crystal orientation in at least two planes in comparison to industrial grade diamond crystals.

41. The method of claim 40 wherein said polycrystalline diamond layer has an enhanced crystal orientation in the (220) and (400) directions relative to the (111) direction.

42. The method of claim 41 wherein said polycrystalline diamond layer further includes an enhanced crystal orientation in the (311) direction relative to the (111) direction.

43. The method of claim 40 wherein said polycrystalline diamond layer has an enhanced crystal orientation in the (311) and (400) directions relative to the (111) direction.

* * * * *